Jan. 12, 1965 J. H. TEAF 3,165,673

RADIO TUNER WITH PRINTED CIRCUIT TERMINAL BOARD

Filed Dec. 15, 1961

INVENTOR.
JOHN H. TEAF
BY
Beaman, Smith & Hanley
ATTORNEYS

United States Patent Office 3,165,673

Patented Jan. 12, 1965

3,165,673

RADIO TUNER WITH PRINTED CIRCUIT TERMINAL BOARD

John H. Teaf, Merchantville, N.J., assignor, by mesne assignments, to Thompson Ramo Wooldridge Inc., Euclid, Ohio, a corporation of Ohio Filed Dec. 15, 1961, Ser. No. 159,724
7 Claims. (Cl. 317—101)

This invention relates to radio tuners, and more particularly, to a new and improved terminal board having rigid and flexible portions whereby vibration and temperature changes are precluded from affecting the accuracy of tuning.

Heretofore, it has been the general practice in the tuner art to provide the tuning coils or capacitors with fine wire leads arranged to be connected by soldering to the appropriate elements of a radio circuit associated with the tuner. This practice is objectionable in that it requires a multiplicity of wires which must be sorted and properly connected to their respective components in the radio circuit and, in addition, the loose wires are subject to spatial changes of position which cause inductance and capacitance changes in the tuner. These disadvantages are overcome by the use of a printed circuit terminal board, the terminals of which may be directly soldered to those of a printed circuit associated with the circuit elements of the receiver, the tuning elements of the tuner being connected to the terminal board by short leads which are not subject to the above recited changes of position which might affect the accuracy of tuning.

But interconnections of two printed circuit boards are liable to be broken by vibration or by temperature changes, and it is the object of the present invention to provide, particularly, arrangements which will maintain continuity of connections despite these occurrences and without special dislocations of the lead elements which, by reason of changes of inductances of capacitances, might affect tuning accuracy.

The attainment of the foregoing and other objects of the invention, particularly relating to details of construction will become more fully apparent from the following description when read in conjunction with the accompanying drawing, in which.

Figures 1, 2, 6, 7:
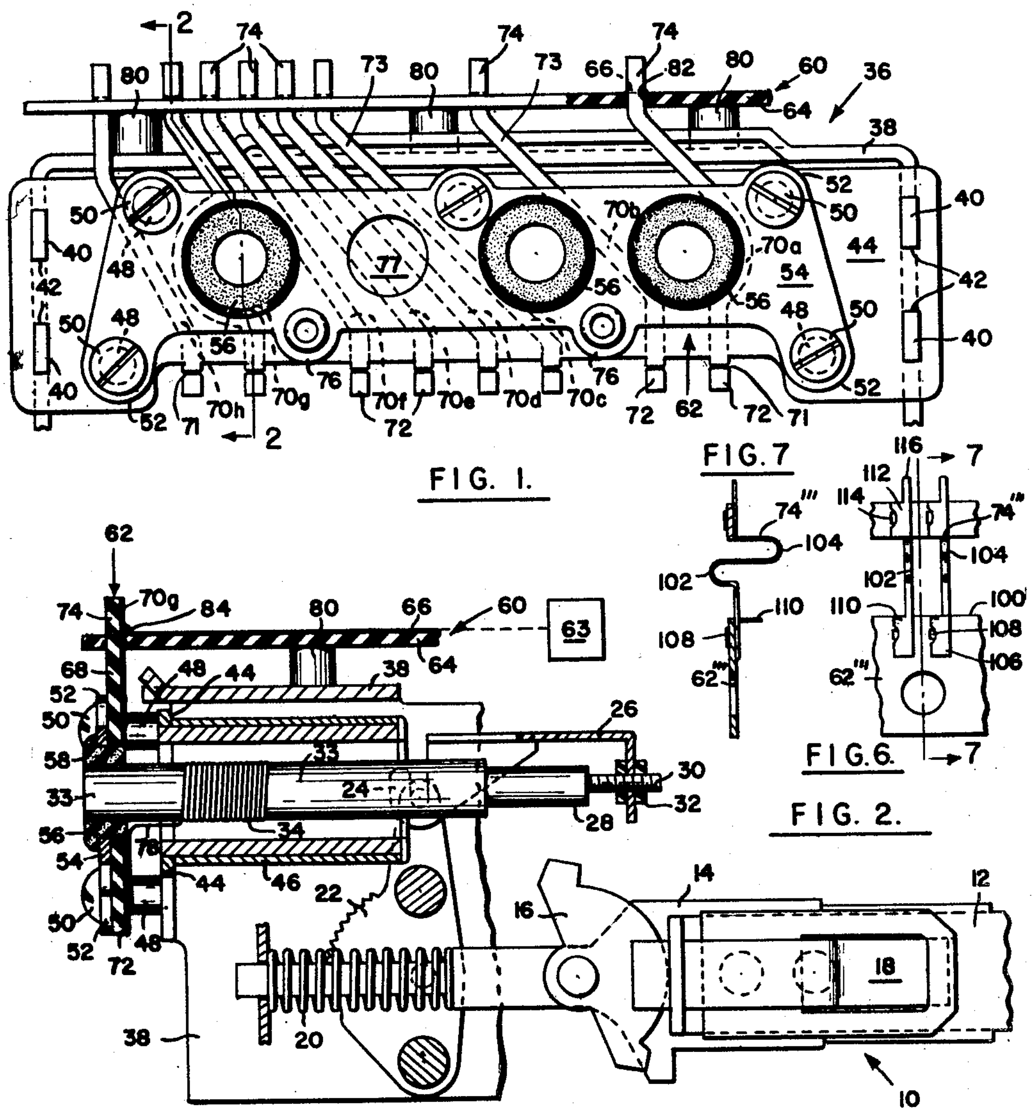
FIGURE 1 is a rear elevational, partly in section, showing the printed circuit terminal board and the printed circuit radio board in their interconnected relationship.
FIGURE 2 is a sectional view taken along line 2—2 of FIGURE 1 showing a printed circuit terminal board, a tuning coil, and a push button actuating mechanism for tuning a plurality of coils.
FIGURE 6 is a side elevational view of a third alternative construction of the terminal board.
FIGURE 7 is a sectional view taken along line 7—7 of FIGURE 6.

Referring to FIGURES 1 and 2, there is shown a push button assembly, generally designated 10, which includes first and second slide members 12 and 14, cam 16, cam clamp 18, spring 20, paddle assembly 22, yoke 24 and carriage 26 to which one of the tuning slugs 28 is connected by means of adjusting screw 30 mounted within a resilient grommet 32. It will be understood that upon actuation of the push button assembly, the plurality of tuning slugs 28 are slidably adjusted within coils 34 whereby the selection of the desired station is accomplished. The above recited structural elements form no part of the present invention and are more fully described in detail in applicant's prior Patent No. 2,848,900, issued August 26, 1958. Various other similar arrangements are commonly used in this art and, briefly stated, effect simultaneous adjustments of slugs in associated cores for tuning of associated circuits with proper tracking.

The tuner assembly 36 includes a main frame 38 having lugs 40 which engage slots 42 of support plate 44, the latter being integral with coil casings 46 and bosses 48 which are internally threaded for the reception of screws 50.

Screws 50 pass through tab portions 52 of a coil supporting plate 54 and secure the latter plate to plate 44. In turn, coils 34 are mounted in suitable apertures in coil support plate 54 by means of resilient grommets 56 which tightly grip tubes 33 carrying coils 34. Grommets 56 are provided with enlarged end portions 58 which overlie coil support plate 54. Thus, each of coils 34 is positively prevented from moving longitudinally along its axis; but resilient grommets 56 allow a limited tilting movement of the coils thus facilitating the free sliding movement of cores 28 therein.

Reference may now be made to the electrical connections between coils 34 and the printed circuit assembly board 60 of the receiver which is achieved by the use of the printed circuit terminal board 62. Board 60 comprises an insulating material portion 64 surfaced with a plurality of conductive lead portions 66 which connect with the appropriate circuit elements 63 of the receiver mounted on and supported by board 60, one of leads 66 being shown in section in FIG. 2. Similarly, terminal board 62 includes an insulating portion 68 which, for example, may be composed of a phenol-formaldehyde resin and a plurality of printed circuit leads 70*a*–70*h*. Insulated portion 68 includes lower tab portions 72 which depend from the lower edge of the board a short distance, upper tabs 74 which projection upwardly from the upper edge of the board for a considerably greater distance, and a central portion 77 the upper edge of which is coincident with the upper edge of plate 54 and the lower edge of which is coincident with the lower edge of riveted tab portions 76 by means of which terminal board 62 is securely fastened to support plate 54.

As shown most clearly in FIGURES 1 and 2, printed leads 70*a*–70*h* extend along the surface of the tabs 72, across the surface of central portion 77 and up along the surface of upper tabs 74. At this point it should be noted that FIGURE 1 illustrates an embodiment having three tuning coils as is common in the tuning art, however, a provision is made in plates 44 and 54 for a fourth coil which, if employed, would utilize a modified form of terminal board 62 wherein printed circuit leads 70*d* and 70*e* curve around the fourth coil as do leads 70*a* and 70*g*.

The lower tabs 72 are rigid and provide solid securing points for the attachment of coil leads 78 which may be attached, for example, by dip soldering after being wound about grooves 71 in tabs 72. On the other hand, upper tabs 74 are relatively resilient both laterally, as viewed in FIGURES 1 and 2, and in addition, due to the slanted angle at which portions 73 of tabs 74 extend, tabs 74 have a predetermined degree of vertical resiliency.

Referring to assembly board 60, it will be apparent that a plurality of apertures 82 are provided therein, there being one such aperture for each of tabs 74 and printed leads 66 so that when tabs 74 are snugly fitted into apertures 82, each of leads 70*a*–70*h* is juxtaposed to one of leads 66 whereby each set of leads 70 and 66 may be soldered together at 84 to thereby form a secure connection which, because of the resiliency of tabs 74, is not effected by the vibration of board 60 which occurs even though the latter may be secured to frame member 38 as shown at 80. In addition, the use of printed circuit terminal board 62 having immovable leads 70a–70h also solves the problem of inductance and capacitance changes heretofore present with the use of fine wire leads which were subject to considerable changes of position between otherwise identical tuner assemblies.

Figure 3:
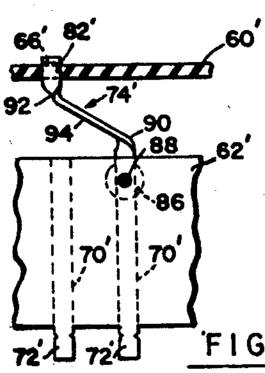
FIGURE 3 is an elevational view, partly in section, showing a first alternative construction of the terminal board.

FIGURE 3 illustrates an alternative form of the invention wherein terminal board 62' is provided with a plurality of lower tabs 72' and printed leads 70' corresponding in structure and function to tabs 72 and leads 70a–70h as previously disclosed. However, integral tabs 74 are replaced by separate tabs 74' having their lower ends suitably enlarged at 86 for the reception of rivets 88 which structurally and electrically connect leads 70' and tabs 74'. In addition, solder may be added to increase the rigidity of the electrical connection between enlarged portions 86 and printed leads 70'. Tabs 74' may be composed of any conductive metal such as a copper alloy, for example, and are of uniform rectangular cross-section throughout their length except for their enlarged portions 86. In order to provide the desired degree of lateral as well as vertical resiliency, tabs 74' are twisted 90° in one direction at 90 and again twisted 90° in the opposite direction at 92 with their intermediate portions 94 being bent at an acute angle with respect to the horizontal edge of board 62'. Thus, tabs 74' have an inherent stiffness due to their metallic composition and also a natural resiliency both laterally and vertically due to their twisted portions 90, 92 and the slanted angle of intermediate portions 94.

Upon assembly, the upper portions of tabs 74' are snugly received in suitable apertures 82' provided in assembly board 60' and soldered to the respective leads 66' in the manner previously disclosed in the description of FIGURES 1 and 2.

Figure 4:
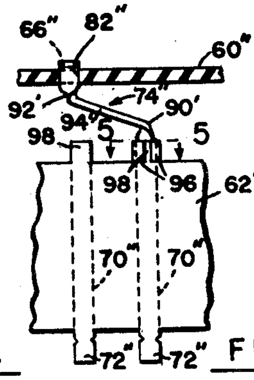
FIGURE 4 is an elevational view, partly in section, showing a second alternative construction of the terminal board.
Figure 5:
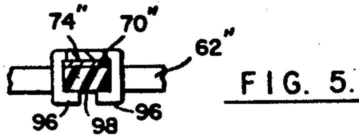
FIGURE 5 is a sectional view taken along line 5—5 of FIGURE 4.

FIGURES 4 and 5 illustrate another alternative form of construction wherein terminal board 62'' is provided with a plurality of lower tabs 72'' and printed leads 70'' which are identical in structure and function to tabs 72, 72', and leads 70a–70h, 70'. In addition, tabs 74'' may be of the same material as tabs 74' and are provided with twisted portions 90', 92' and intermediate portions 94' bent at an angle with respect to the horizontal edge of board 62'' thereby having the same stiffness and resiliency previously disclosed in the description of FIGURE 3. The form of the invention illustrated in FIGURES 4 and 5 differs from that of FIGURE 3 in that enlarged portions 86 are replaced by enlarged portions 96 which are crimped about studs 98 integral with and projecting upwardly from board 62''. This form of the invention has a further similarity to that illustrated in FIGURES 1–2 in that leads 70'' extend upwardly along the surface of studs 98 so that electrical contact is established between leads 70'' and tabs 74'' as more clearly shown in section in FIGURE 5, and it will be understood that soldering may also be employed to increase the rigidity of the connection in addition to that provided by the crimping of portions 96 about studs 98.

As in the previously described embodiments, the upper ends of tabs 74'' are snugly fitted into apertures 82'' in assembly board 60'' and the connection may be soldered to provide a secure electrical connection between each of tabs 74'' and its corresponding lead 66''.

Reference is now made to FIGURES 6 and 7 wherein a third alternative construction of the assembly board is illustrated. This embodiment of the invention includes an insulated terminal board 62''' which may be secured to the tuner assembly in the same manner as that shown in FIGURE 2 with regard to the first form of the invention. Terminal board 62''' is provided with a plurality of metallic tabs 74''' which extend at right angles to the horizontal edge 100 of board 62'''. Tabs 74''' are preferably stamped from a thin metallic sheet and thereafter bent in the form of a figure 8. Thus, tabs 74''' have an inherent stiffness due to their metallic composition and also have a natural resiliency both laterally and vertically due to their bent portions 102 and 104.

As shown most clearly in FIGURE 6, the lower end of tabs 74''' are integral with an enlarged portion 106 which portion includes a tang 108 which is bent at right angles thereto and thus forms a projection by which the tabs may be secured to board 62'''. Portion 106 further includes a second projection 110 which is bent a right angles and in the opposite direction to that of tang 108. Thus, the latter projection provides a terminal to which the coil leads 78 may be suitably connected by soldering or twisting about projection 110. It will also be noted that the upper ends of tabs 74''' are provided with second enlarged portions 112 from which tangs 114 have been bent at right angles whereby the upper ends may be secured to a common insulating strip so that all of the terminals are held in their properly spaced relationship to one another. Portions 112 further include projections 116 which are adapted to be inserted in appropriate apertures provided in assembly board 60 and snugly received therein as well as soldered thereto if desired.

From the foregoing description it will be apparent that the disclosed invention is particularly well suited to use in automobile tuners wherein problems of temperature change cause distortion in the tuning system and wherein the problem of vibration has in the past led to the failure of electrical connections. In addition, the use of the above disclosed invention further results in considerable savings in time as well as preventing mistakes in wiring the coils of the tuner to the various radio components.

It will be apparent that numerous modifications and alterations may be made in construction without departing from the scope of the invention as set forth in the following claims.

What is claimed is:

1. In a radio including a plurality of tuning means and a printed circuit assembly board, a terminal board, said terminal board including a plurality of rigid portions and a plurality of extensions flexible in both lateral and longitudinal directions, means connecting said tuning means to said rigid portions and second means connecting said assembly board to said flexible extensions.

2. In a radio including a plurality of tuning means and a printed circuit assembly board, a printed circuit terminal board, said terminal board including a plurality of rigid tabs and a plurality of flexible tabs, said flexible tabs having a greater length than said rigid tabs, said tuning means being connected to said rigid tabs and said flexible tabs electrically engaging said assembly board.

3. In a radio including a plurality of tuning means and a plurality of electronic components, a printed circuit terminal board, said board including a plurality of rigid portions and a plurality of integral, flexible portions, said flexible portions extending from said terminal board in an angular configuration so as to be flexible in both lateral and longitudinal directions, said tuning means being connected to said rigid portions and said components being connected to said flexible portions.

4. In a radio including a plurality of tuning means and a plurality of electronic components, a terminal board, said board including a plurality of rigid portions, a plurality of separate, flexible tabs attached to said board, said tuning means being connected to said rigid portions and said flexible tabs being connected to said components and an assembly board supporting said components and having a plurality of terminals connected to said components, said flexible tabs electrically engaging said terminals.

5. In a radio including a plurality of tuning means and a plurality of electronic components, a printed circuit terminal board, said board including a plurality of rigid portions and a plurality of stud portions, separate, flexible tabs attached to said stud portions and electrically connected to the printed circuits thereof, said tuning means being connected to said rigid portions and said flexible tabs being connected to said components and an assembly board supporting said components and having a plurality of terminals connected to said components, said flexible tabs electrically engaging said terminals.

6. In a radio including a plurality of tuning means and a plurality of electronic components, a printed circuit terminal board, said board including a plurality of rigid portions and a plurality of separate, flexible tabs attached to said board and electrically connected to the printed circuits thereof, said tabs being twisted intermediate their length, said tuning means being connected to said rigid portions and said flexible tabs being connected to said components.

7. In a radio including a plurality of tuning means and a plurality of electronic components, a terminal board, a plurality of separate, flexible tabs attached to said board, said tabs being bent in the form of a figure S, said tabs further including projections at opposite ends, said projections being connected to said tuning means and to said components.

References Cited in the file of this patent

UNITED STATES PATENTS

| | | |
|---|---|---|
| 2,718,623 | Yoder et al. | Sept. 20, 1955 |
| 2,748,364 | Kamm | May 29, 1956 |